(12) United States Patent
Chen et al.

(10) Patent No.: US 12,740,422 B2
(45) Date of Patent: Sep. 15, 2026

(54) ELECTRONIC DEVICE

(71) Applicant: Advanced Semiconductor Engineering, Inc., Kaohsiung (TW)

(72) Inventors: Hsin-Yu Chen, Kaohsiung (TW); Huei-Shyong Cho, Kaohsiung (TW); Shih-Wen Lu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 924 days.

(21) Appl. No.: 17/877,796

(22) Filed: Jul. 29, 2022

(65) Prior Publication Data

US 2024/0038678 A1 Feb. 1, 2024

(51) Int. Cl.

| | |
|---|---|
| ***H10W 42/20*** | (2026.01) |
| ***H10W 70/60*** | (2026.01) |
| ***H10W 70/65*** | (2026.01) |
| ***H10W 90/00*** | (2026.01) |

(52) U.S. Cl.

CPC .......... *H10W 42/20* (2026.01); *H10W 70/611* (2026.01); *H10W 70/614* (2026.01); *H10W 70/65* (2026.01); *H10W 90/00* (2026.01); *H10W 90/401* (2026.01); *H10W 90/701* (2026.01); *H10W 70/60* (2026.01); *H10W 90/724* (2026.01)

(58) Field of Classification Search

CPC ............. H01L 23/552; H01L 23/49816; H01L 23/49833; H01L 23/49838; H01L 23/5385; H01L 23/5386; H01L 23/5389; H01L 25/105; H01L 25/162; H01L 24/16; H10W 90/00; H10W 90/401; H10W 90/701; H10W 90/724; H10W 72/20; H10W 70/611; H10W 70/614; H10W 70/65; H10W 70/60; H10W 42/20; H10W 42/263; H10W 42/276; H05K 2201/10378

See application file for complete search history.

(56) References Cited

U.S. PATENT DOCUMENTS

| | | | | |
|---|---|---|---|---|
| 9,018,741 | B2 | 4/2015 | Kim et al. | |
| 10,991,656 | B2 * | 4/2021 | Yeh | H10W 70/611 |
| 11,637,089 | B2 * | 4/2023 | Choi | H10W 70/611 257/773 |
| 2019/0229100 | A1 * | 7/2019 | Im | H10W 90/00 |
| 2020/0075490 | A1 * | 3/2020 | Sung | H10W 70/635 |
| 2020/0273799 | A1 * | 8/2020 | Sung | H10W 70/611 |
| 2021/0074641 | A1 * | 3/2021 | Sung | H01L 23/5381 |
| 2022/0157702 | A1 * | 5/2022 | Choi | H10W 90/00 |

* cited by examiner

*Primary Examiner* — Omar F Mojaddedi

(74) *Attorney, Agent, or Firm* — Foley & Lardner LLP

(57) ABSTRACT

The present disclosure provides an electronic device. The electronic device includes a first interposer, a first interconnection array, a first shielding wall, and a second interconnection array. The first interconnection array is disposed in the first interposer and electrically connected to ground. The first shielding wall continuously extends at a side of the first interconnection array. The second interconnection array is disposed between the first shielding wall and the first interconnection array. The second interconnection array is configured to transmit a signal.

20 Claims, 14 Drawing Sheets

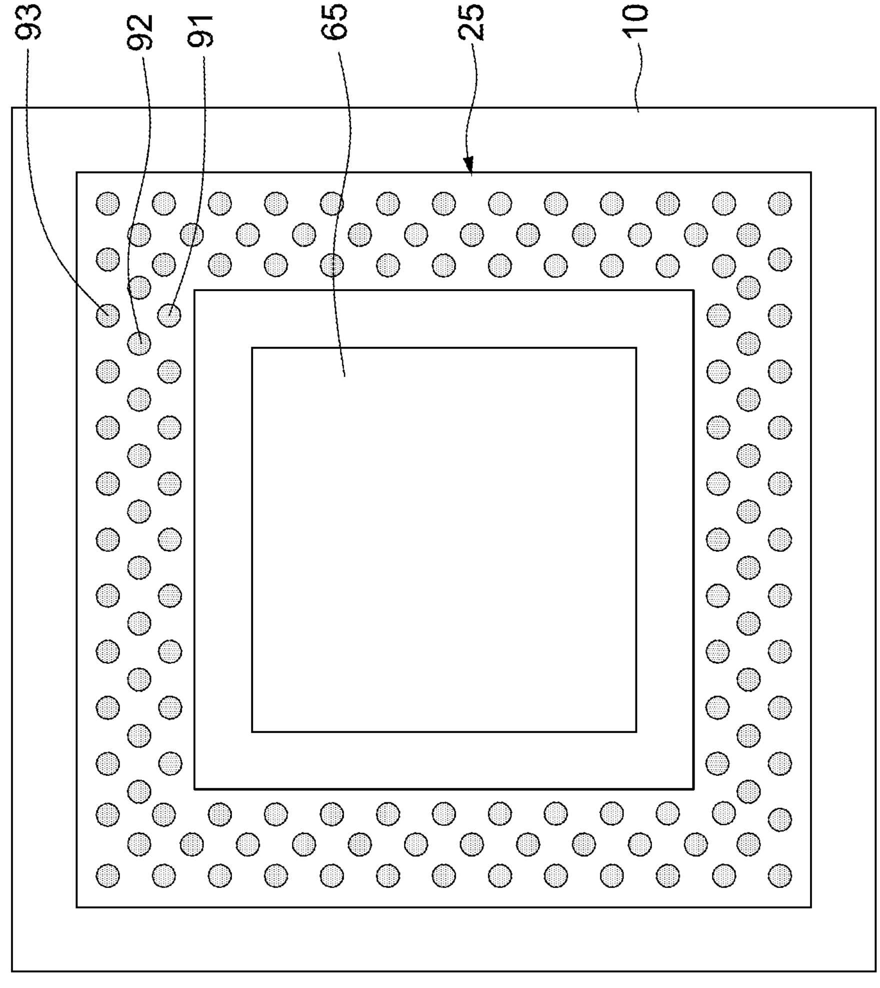
FIG. 7A

ELECTRONIC DEVICE

BACKGROUND

1. Field of the Disclosure

The present disclosure generally relates to an electronic device, and more particularly, to an electronic device including a shielding wall.

2. Description of the Related Art

To meet characteristic impedance of an electronic device, which transmits a signal with a relatively high frequency (e.g., radio frequency (RF) signal), three or more arrays of interconnections are utilized in an interposer.

However, in some situations, such configuration may require an undesirable increase in device size. Therefore, a new electronic device is required.

SUMMARY

In some embodiments, an electronic device includes a first interposer, a first interconnection array, a first shielding wall, and a second interconnection array. The first interconnection array is disposed in the first interposer and electrically connected to ground. The first shielding wall continuously extends at a side of the first interconnection array. The second interconnection array is disposed between the first shielding wall and the first interconnection array. The second interconnection array is configured to transmit a signal.

In some embodiments, an electronic device includes an interposer, a first interconnection, a second interconnection, and a first electrical shielding layer. The interposer has a first edge and a second edge opposite to the first edge. The first interconnection is disposed in the first interposer and configured to transmit a ground signal. The second interconnection is disposed in the first interposer and configured to transmit a non-ground signal. The first electrical shielding layer is adjacent to the first edge of the interposer. A projected length from the first interconnection to the second interconnection is greater than a first distance between the second interconnection and the first edge. The projected length is a projection of a length starting at the first interconnection and ending at the second interconnection as projected on an imaginary plane perpendicular to the first edge of the interposer.

In some embodiments, an electronic device includes a first substrate, a second substrate, an interposer, and an electrical shielding layer. The second substrate is disposed over the first substrate. The interposer is disposed between the first substrate and the second substrate. The interposer includes a ground connection and a signal connection. The electrical shielding layer extends from a side of the first substrate to a side of the second substrate. The ground connection and the electrical shielding layer are configured to prevent the signal connection from electromagnetic interference.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

FIG. 7A is a top view of an electronic device of a comparative example.

DETAILED DESCRIPTION

Figure 1A:
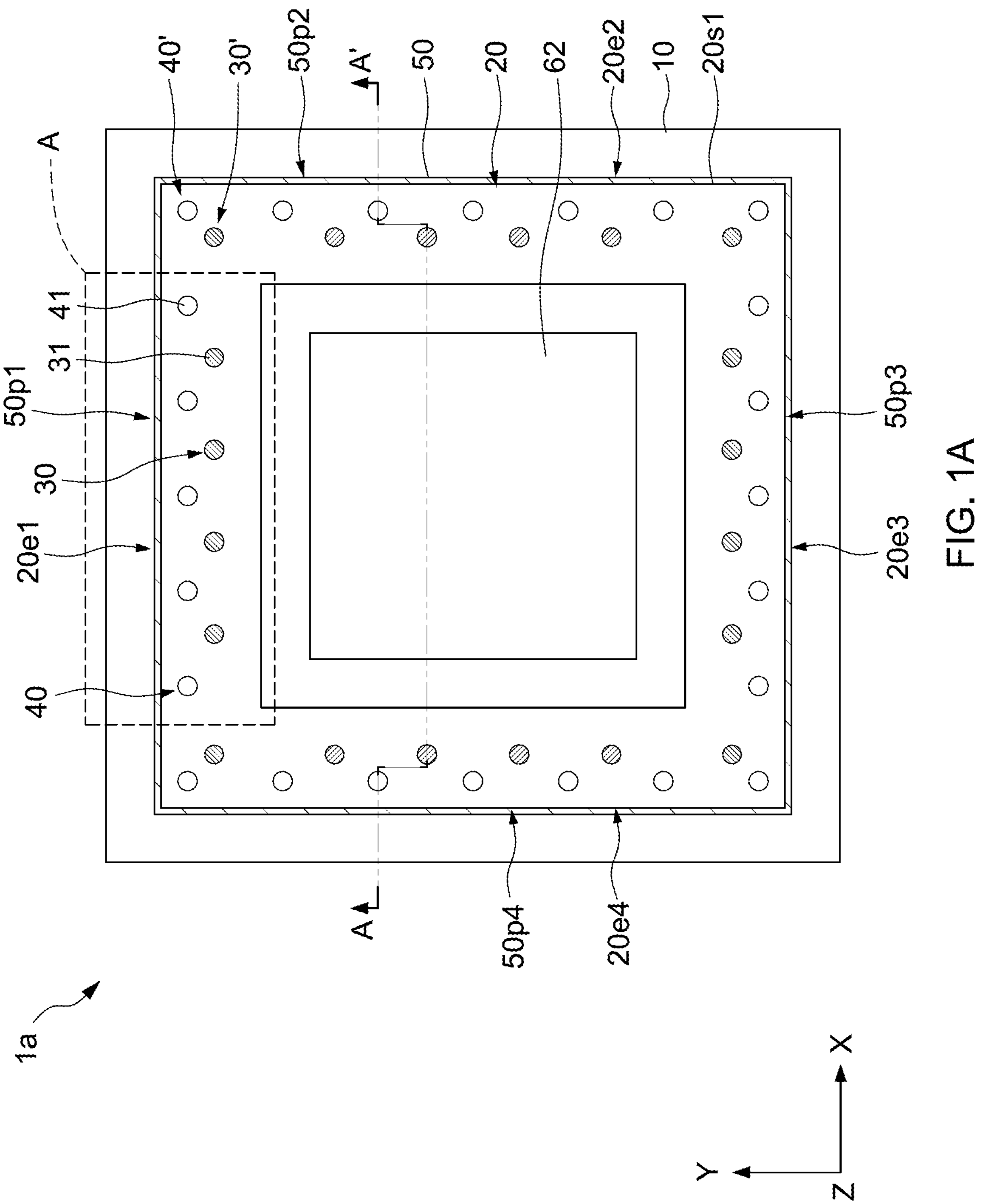
FIG. 1A is a top view of an electronic device, in accordance with an embodiment of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A is a top view of an electronic device 1*a*, in accordance with an embodiment of the present disclosure.

In some embodiments, the electronic device 1*a* may include a carrier 10, a interposer 20, interconnection arrays (e.g., 30 and 30'), interconnection arrays (e.g., 40 and 40'), an electrical shielding layer 50, and electronic components (e.g., 62).

The interposer 20 may be disposed over the carrier 10. The interposer 20 may be configured to accommodate at least a part of an interconnection array. In some embodiments, the interposer 20 may have edges 20*e*1, 20*e*2, 20*e*3, and 20*e*4. The edge 20*e*1 may be opposite to the edge 20*e*3. Each of the edges 20*e*1 and 20*e*3 may extend along the X-axis. The edge 20*e*2 may be opposite to the edge 20*e*4. Each of the edges 20*e*2 and 20*e*4 may extend along the Y-axis. Each of the edges 20*e*1, 20*e*2, 20*e*3, and 20*e*4 may also be referred to as an outer edge.

In some embodiments, each of the interconnection arrays 30 and 30' may be electrically connected to ground or be configured to transmit a ground signal. In some embodiments, each of the interconnection arrays 30 and 30' may have a plurality of interconnections 31. The interconnection array 30 may be disposed at the edge 20*e*1 of the interposer 20. The interconnection array 30' may be disposed at the edge 20*e*2 of the interposer 20. The plurality of interconnections 31 may surround the electronic components (e.g., 62). Each of the interconnections 31 may be aligned along the X-axis or the Y-axis. In some embodiments, each of the interconnections 31 may be electrically connected to ground or be configured to transmit a ground signal. The interconnection array 30 may also be referred to as an inner interconnection array.

In some embodiments, the interconnection array 40 may be disposed between the electrical shielding layer 50 and the interconnection array 30. In some embodiments, each of the interconnection arrays 40 and 40' may be electrically connected to transmit a non-ground signal or a signal (e.g., data signal). The interconnection array 40 may be disposed at the edge 20*e*1 of the interposer 20. The interconnection array 40' may be disposed at the edge 20*e*2 of the interposer 20. In some embodiments, each of the interconnection arrays 40 and 40' may include a plurality of interconnections 41. Each of the interconnections 41 may be aligned along the X-axis or the Y-axis. In some embodiments, each of the interconnection 41 may be configured to transmit a non-ground signal or a data signal, such as a radio frequency (RF) signal or other signals. In some embodiments, the interconnection array 30 and the interconnection array 40 may be arranged in a staggered arrangement. In some embodiments, the interconnections 31 and the interconnections 41 may be arranged in a staggered arrangement. For example, the interconnection 31 is free from overlapping with the interconnection 41 along an orientation (e.g., the Y-axis) perpendicular to an extending axis (e.g., the X-axis) of the electrical shielding layer 50. The interconnection array 40 may also be referred to as an outer interconnection array.

In some embodiments, the electrical shielding layer 50 may be disposed on or over an external surface (e.g., surface 20*s*1) of the interposer 20. In some embodiments, the electrical shielding layer 50 may surround or enclose the interconnection arrays 30 and 30'. In some embodiments, the electrical shielding layer 50 may surround or enclose the interconnection arrays 40 and 40'. In some embodiments, the electrical shielding layer 50 may be configured to prevent a signal (e.g., a data signal), passing through the interconnection 41, from attenuation or distortion. In some embodiments, the electrical shielding layer 50 may be configured to protect the electronic components (e.g., 62) from electromagnetic interference (EMI). In some embodiments, the thickness (not annotated in the figures) is less than the diameter (not annotated in the figures) of the interconnection 31 and/or 41. For example, the thickness of the electrical shielding layer 50 may range from about 1 μm to about 10 μm, while the diameter of the interconnection 31 and/or 41 may range from about 0.1 mm to about 0.5 mm.

In some embodiments, the electrical shielding layer 50 may include shielding walls 50*p*1, 50*p*2, 50*p*3, and 50*p*4. In some embodiments, the shielding wall 50*p*1 may continuously extend along the edge 20*e*1 of the interposer 20. In some embodiments, the shielding wall 50*p*2 may continuously extend along the edge 20*e*2 of the interposer 20. In some embodiments, the shielding wall 50*p*3 may continuously extend along the edge 20*e*3 of the interposer 20. In some embodiments, the shielding wall 50*p*4 may continuously extend along the edge 20*e*4 of the interposer 20. The shielding wall 50*p*2 may extend from the shielding wall 50*p*1. In some embodiments, the shielding wall 50*p*1 may continuously extend between the edges 20*e*2 and 20*e*4 of the interposer 20. In some embodiments, the shielding wall 50*p*1 may be in contact with the shielding wall 50*p*2. In some embodiments, the shielding walls 50*p*1, 50*p*2, 50*p*3, and 50*p*4 may be connected to each other. In some embodiments, each of the shielding walls 50*p*1, 50*p*2, 50*p*3, and 50*p*4 may extend along a side of the interconnection array (e.g., 30, 30', 40, or 40')

Figure 1B:
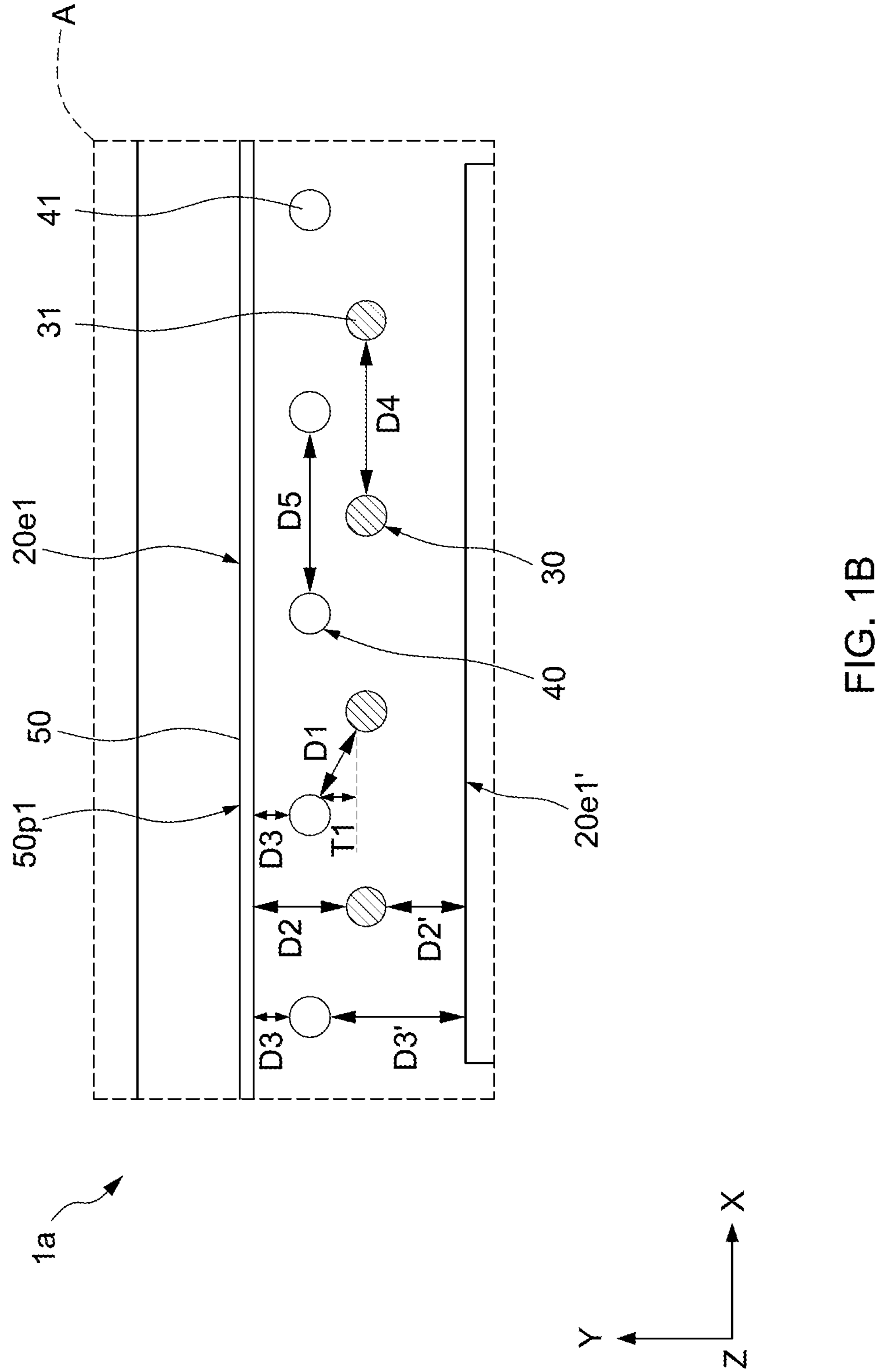
FIG. 1B is an enlarged view of region A of the electronic device as shown in FIG. 1A, in accordance with an embodiment of the present disclosure.

FIG. 1B is an enlarged view of region A of the electronic device as shown in FIG. 1A, in accordance with an embodiment of the present disclosure.

The interconnections 31 and 41 may have a distance D1 therebetween. In some embodiments of the present disclosure, the distance D1 is a length starting at the interconnection 31 and ending at the interconnection 41. In some embodiments of the present disclosure, the distance D1 is a length starting at a peripheral of the interconnection 31 and ending at a peripheral the interconnection 41. In some embodiments of the present disclosure, the distance D1 is a length starting at a cross-sectional center of the interconnection 31 and ending at a cross-sectional center of the interconnection 41. The interconnection 31 and the edge 20*e*1 of the interposer 20 (or electrical shielding layer 50) may have a distance D2 (along the Y-axis) therebetween. In some embodiments of the present disclosure, the distance D2 is a length starting at the interconnection 31 and ending at edge 20*e*1 of the interposer 20. In some embodiments of the present disclosure, the distance D2 is a length starting at a peripheral of the interconnection 31 and ending at edge 20*e*1 of the interposer 20. In some embodiments of the present disclosure, the distance D2 is a length starting at a cross-sectional center of the interconnection 31 and ending at edge 20*e*1 of the interposer 20. The interconnection 41 and the edge 20*e*1 of the interposer 20 (or electrical shielding layer 50) may have a distance D3 (along the Y-axis) therebetween. In some embodiments of the present disclosure, the distance D3 is a length starting at the interconnection 41 and ending at edge 20*e*1 of the interposer 20. In some embodiments of the present disclosure, the distance D3 is a length starting at a peripheral of the interconnection 41 and ending at edge 20*e*1 of the interposer 20. In some embodiments of the present disclosure, the distance D3 is a length starting at a cross-sectional center of the interconnection 41 and ending at edge 20*e*1 of the interposer 20. In some embodiments, the distance D3 is less than the distance D2. In some embodiments, the distance D3 is less than the distance D1. For example, the distance D1 may range from about 0.3 mm to about 1.5 mm. The distance D1 may be 0.6 mm. The distance D2 may range from about 0.25 mm to about 1.5 mm. The distance D3 may range from about 0.1 mm to about 0.4 mm. The distance D3 may be 0.195 mm.

The interposer 20 may have an edge 20*e*1' opposite to the edge 20*e*1. The edge 20*e*1' may also be referred to as an inner edge. The interconnection 31 and the edge 20_e_1' of the interposer 20 may have a distance D2' (along the Y-axis) therebetween. In some embodiments of the present disclosure, the distance D2' is a length starting at the interconnection 31 and ending at edge 20_e_1' of the interposer 20. In some embodiments of the present disclosure, the distance D2' is a length starting at a peripheral of the interconnection 31 and ending at edge 20_e_1' of the interposer 20. In some embodiments of the present disclosure, the distance D2' is a length starting at a cross-sectional center of the interconnection 31 and ending at edge 20_e_1' of the interposer 20. The interconnection 41 and the edge 20_e_1' of the interposer 20 may have a distance D3' (along the Y-axis) therebetween. In some embodiments of the present disclosure, the distance D3' is a length starting at the interconnection 41 and ending at edge 20_e_1' of the interposer 20. In some embodiments of the present disclosure, the distance D3' is a length starting at a peripheral of the interconnection 41 and ending at edge 20_e_1' of the interposer 20. In some embodiments of the present disclosure, the distance D3' is a length starting at a cross-sectional center of the interconnection 41 and ending at edge 20_e_1' of the interposer 20. In some embodiments, the distance D2' is less than the distance D2. In some embodiments, the distance D3' is greater than the distance D3. The interconnection 31 and the interconnection 41 may have a projected length T1 along the Y-axis. The projected length T1 may be defined as a projection of a length starting at the interconnection 31 and ending at the interconnection 41 as projected to a direction, such as Y-axis. In some embodiments, the projected length T1 may be greater than the distance D3. In some embodiments, the projected length T1 may be less than the distance D3.

Two adjacent interconnections 31 may have a distance D4 (or a pitch) therebetween. In some embodiments of the present disclosure, the distance D4 is a length starting at one interconnection 31 and ending at another interconnection 31. In some embodiments of the present disclosure, the distance D4 is a length starting at a peripheral of one interconnection 31 and ending at a peripheral another interconnection 31. In some embodiments of the present disclosure, the distance D4 is a length starting at a cross-sectional center of one interconnection 31 and ending at a cross-sectional center of another interconnection 31. Two adjacent interconnections 41 may have a distance D5 (or a pitch) therebetween. In some embodiments of the present disclosure, the distance D5 is a length starting at one interconnection 41 and ending at another interconnection 41. In some embodiments of the present disclosure, the distance D5 is a length starting at a peripheral of one interconnection 41 and ending at a peripheral another interconnection 41. In some embodiments of the present disclosure, the distance D5 is a length starting at a cross-sectional center of one interconnection 41 and ending at a cross-sectional center of another interconnection 41. In some embodiments, the distance D4 may substantially equal the distance D5. In some embodiments, the distance D1 may be less than the distance D4. In some embodiments, the distance D1 may be less than the distance D5. For example, the distance D4 may range from about 0.5 mm to about 2.5 mm. The distance D5 may range from about 0.5 mm to about 2.5 mm. In addition, a width of the shielding wall may be 0.5 um.

In some embodiments, the interconnection array 30 and the electrical shielding layer 50 may be collectively configured to reduce attenuation or distortion of a signal (e.g., an RF signal) passing through the interconnection 41. In some embodiments, the interconnection array 30 and the electrical shielding layer 50 may be configured to determine or modify a characteristic impedance. The characteristic impedance may depend on a frequency at which a signal operates. In some embodiments, the interconnection 41 may be configured to transmit a signal with a relatively high frequency (e.g., the frequency exceeding 10 GHz), which requires a relatively large characteristic impedance to reduce signal distortion.

Figure 1C:
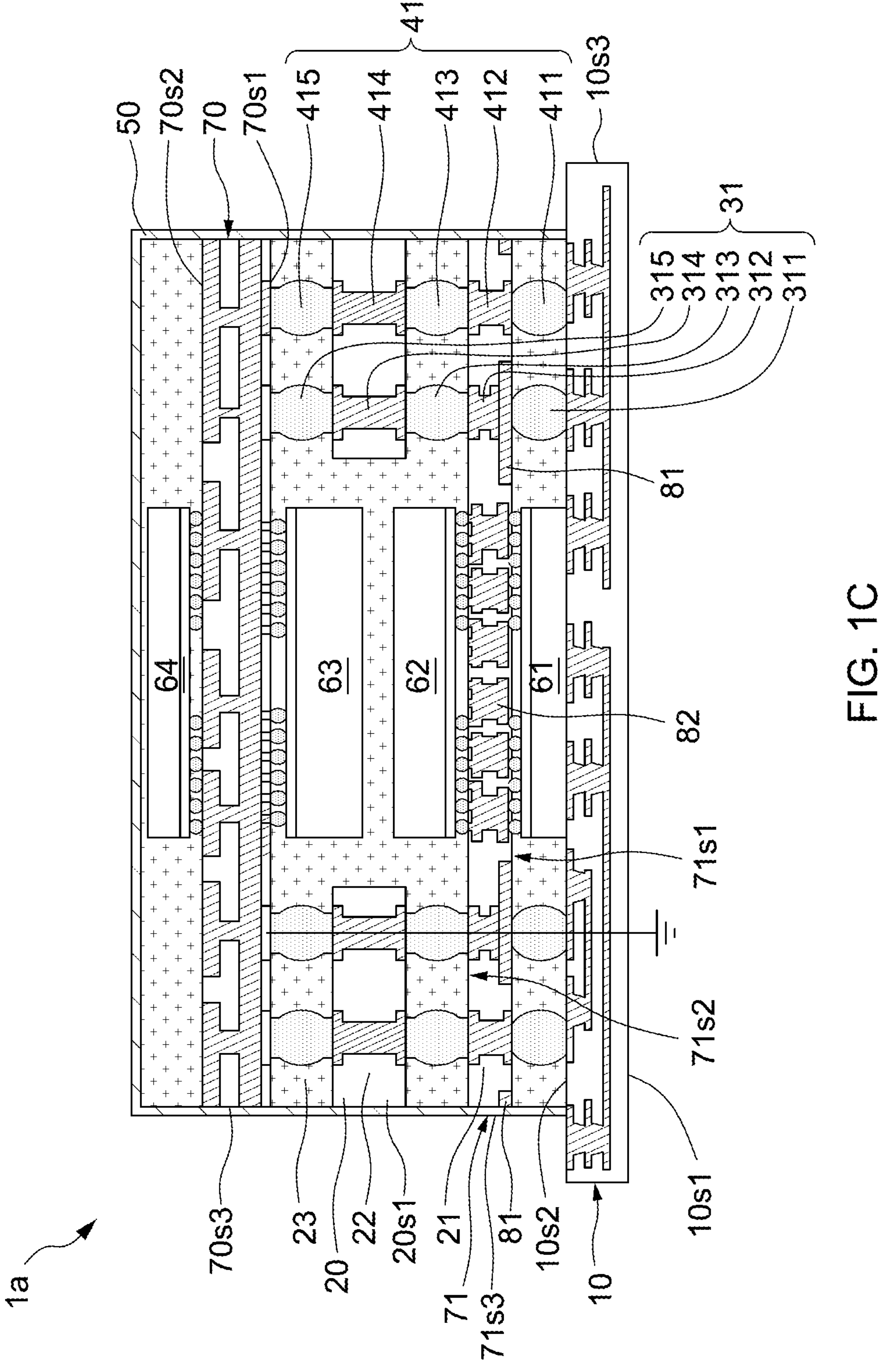
FIG. 1C is a cross-sectional view along line A-A' of the electronic device as shown in FIG. 1A, in accordance with an embodiment of the present disclosure.

FIG. 1C is a cross-sectional view along line A-A' of the electronic device 1_a_ as shown in FIG. 1A, in accordance with an embodiment of the present disclosure.

In some embodiments, the carrier 10 may be or include, for example, a printed circuit board, such as a paper-based copper foil laminate, a composite copper foil laminate, or a polymer-impregnated glass-fiber-based copper foil laminate. In this disclosure, the carrier 10 may also be referred to as a substrate.

The carrier 10 may have a surface 10_s_1 (which may also be referred to as a lower surface), a surface 10_s_2 (which may also be referred to as an upper surface) opposite to the surface 10_s_1, and a surface 10_s_3 (which may also be referred to as a lateral surface) extending between the surface 10_s_1 and the surface 10_s_2.

In some embodiments, the carrier 10 may include conductive pad(s), trace(s), via(s), layer(s), or other interconnection(s). For example, the carrier 10 may include one or more transmission lines (e.g., communications cables) and one or more grounding lines and/or grounding planes. For example, the carrier 10 may include one or more conductive pads (not shown in the figures) in proximity to, adjacent to, or embedded in and exposed by the surface 10_s_1 and/or the surface 10_s_2 of the carrier 10. The carrier 10 may include a solder resist (not shown in the figures) on the surface 10_s_1 and/or the surface 10_s_2 to fully expose or expose at least a portion of the conductive pads for electrical connections.

The electronic device 1_a_ may include dielectric layers 21, 22, and 23. The dielectric layers 21, 22, and 23 may be disposed on or over the surface 10_s_1 of the carrier 10. The dielectric layer 21 may be disposed over the surface 10_s_2 of the carrier 10. In some embodiments, the dielectric layer 22 may encapsulate a portion of the interconnection 31 and/or 41. In some embodiments, the dielectric layer 23 may encapsulate the dielectric layer 22. In some embodiments, the dielectric layer 23 may encapsulate the electronic components 62 and 63. In some embodiments, a dielectric constant of the dielectric layer 22 may be different from that of the dielectric layer 23. In some embodiments, a dielectric constant of the dielectric layer 22 may be less than that of the dielectric layer 23, which may reduce the size of the electronic device 1_a_. In some embodiments, the material of the dielectric layer 22 may be different from that of the dielectric layer 23. In some embodiments, the material of the dielectric layer 21 may be different from that of the dielectric layer 23. In some embodiments, the material of the dielectric layer 22 may be different from that of the dielectric layer 21. Each of the dielectric layers 21, 22, and 23 may include, for example, pre-impregnated composite fibers, ceramic-filled polytetrafluoroethylene (PTFE) composites, or other suitable materials. The dielectric layer 23 may also be referred to as an encapsulant.

In some embodiments, the interconnection 31 may penetrate the dielectric layers 21, 22, and/or 23. In some embodiments, the interconnection 31 may be electrically connected to the carrier 10. The interconnection 31 may include conductive via(s), trace(s), or other suitable elements. In some embodiments, the interconnection 31 may include, for example, conductive elements 311, 312, 313, 314, and 315. It should be noted that the structure of the interconnection 31 may depend on design requirements, and the present disclosure is not intended to limit the same. For example, the interconnection 31 may include a conductive pillar extending between the carriers 10 and 70 in other embodiments. In some embodiment, the interconnection 31 may refer to the conductive element 314.

The conductive element 311 may be disposed over the surface 10*s*2 of the carrier 10. The conductive element 311 may include a solder material, such as alloys of gold and tin solder or alloys of silver and tin solder.

The conductive element 312 may be disposed over the conductive element 311. The conductive element 312 may include a conductive material such as a metal or metal alloy. Examples of the conductive material include gold (Au), silver (Ag), copper (Cu), platinum (Pt), Palladium (Pd), other metal(s) or alloy(s), or a combination thereof.

The conductive element 313 may be disposed over the conductive element 312. The conductive element 313 may include a solder material, such as alloys of gold and tin solder or alloys of silver and tin solder.

The conductive element 314 may be disposed over the conductive element 313. In some embodiments, the conductive element 314 may be covered by the dielectric layer 22. In some embodiments, the conductive element 314 may be encapsulated by the dielectric layer 22. The conductive element 314 may include a conductive material such as a metal or metal alloy. Examples of the conductive material include gold (Au), silver (Ag), copper (Cu), platinum (Pt), Palladium (Pd), other metal(s) or alloy(s), or a combination thereof.

The conductive element 315 may be disposed over the conductive element 314. The conductive element 315 may include a solder material, such as alloys of gold and tin solder or alloys of silver and tin solder.

The interconnection 41 may penetrate the dielectric layers 21, 22, and/or 23. In some embodiments, the interconnection 41 may be electrically connected to the carrier 10 and/or carrier 70. The interconnection 41 may include conductive via(s), trace(s), or other suitable elements. In some embodiments, the interconnection 41 may include, for example, a conductive elements 411, 412, 413, 414, and 415. It should be noted that the structure of the interconnection 41 may depend on design requirements, and the present disclosure is not intended to limit the same. For example, the interconnection 41 may include a conductive pillar extending between the carriers 10 and 70 in other embodiments. In some embodiment, the interconnection 41 may refer to the conductive element 414.

The conductive element 411 may be disposed over the surface 10*s*2 of the carrier 10. The conductive element 411 may include a solder material, such as alloys of gold and tin solder or alloys of silver and tin solder.

The conductive element 412 may be disposed over the conductive element 411. The conductive element 412 may include a conductive material such as a metal or metal alloy. Examples of the conductive material include gold (Au), silver (Ag), copper (Cu), platinum (Pt), Palladium (Pd), other metal(s) or alloy(s), or a combination thereof.

The conductive element 413 may be disposed over the conductive element 412. The conductive element 413 may include a solder material, such as alloys of gold and tin solder or alloys of silver and tin solder.

The conductive element 414 may be disposed over the conductive element 413. In some embodiments, the conductive element 414 may be covered by the dielectric layer 22. In some embodiments, the conductive element 414 may be encapsulated by the dielectric layer 22. The conductive element 414 may include a conductive material such as a metal or metal alloy. Examples of the conductive material include gold (Au), silver (Ag), copper (Cu), platinum (Pt), Palladium (Pd), other metal(s) or alloy(s), or a combination thereof.

The conductive element 415 may be disposed over the conductive element 414. The conductive element 415 may include a solder material, such as alloys of gold and tin solder or alloys of silver and tin solder.

In some embodiments, the interposer 20 may include the dielectric layer 22, the conductive element 314 and the conductive element 414. The conductive element 314 may also be referred to as a ground connection, which is configured to transmit a ground signal or electrically connected to ground. The conductive element 414 may also be referred to as a signal connection, which is configured to transmit a signal (e.g., data signal).

In some embodiments, the electrical shielding layer 50 may cover an external surface 20*s*1 of the interposer 20. For example, the electrical shielding layer 50 may cover the surface 20*s*1 (or a lateral surface) of the interposer 20. In some embodiments, the electrical shielding layer 50 may cover the dielectric layer 23. shielding layer The electronic device 1*a* may further include a carrier 70. The carrier 70 may be or include, for example, a printed circuit board, such as a paper-based copper foil laminate, a composite copper foil laminate, or a polymer-impregnated glass-fiber-based copper foil laminate. In this disclosure, the carrier 10 may also be referred to as a lower carrier, and the carrier 70 may also be referred to as an upper carrier.

The carrier 70 may have a surface 70*s*1 (which may also be referred to as a lower surface), a surface 70*s*2 (which may also be referred to as an upper surface) opposite to the surface 70*s*1, and a surface 70*s*3 (which may also be referred to as a lateral surface) extending between the surface 70*s*1 and the surface 70*s*2. In some embodiments, the surface 70*s*3 of the carrier 70 may be noncoplanar with the surface 10*s*3 of the carrier 10.

In some embodiments, the carrier 70 may include conductive pad(s), trace(s), via(s), layer(s), or other interconnection(s). The carrier 70 may include one or more conductive pads (not shown in the figures) in proximity to, adjacent to, or embedded in and exposed by the surface 70*s*1 and/or the surface 70*s*2 of the carrier 70. The carrier 70 may include a solder resist (not shown in the figures) on the surface 70*s*1 and/or the surface 70*s*2 to fully expose or to expose at least a portion of the conductive pads for electrical connections.

In some embodiments, the electronic components 61, 62, 63, and 64 may be covered by the electrical shielding layer 50. Each of the electronic components 61, 62, 63, and 64 may be a chip or a die including a semiconductor substrate, one or more integrated circuit (IC) devices and one or more overlying interconnection structures therein. The IC devices may include active devices such as transistors and/or passive devices such as resistors, capacitors, inductors, or a combination thereof. For example, the electronic component 61, 62, 63, and/or 64 may include a system on chip (SoC). For example, the electronic component 61, 62, 63, and/or 64 may include an application-specific IC (ASIC), a radio frequency integrated circuit (RFIC), a central processing unit (CPU), a microprocessor unit (MPU), a graphics processing unit (GPU), a microcontroller unit (MCU), a field-programmable gate array (FPGA), or another type of IC.

Electronic components 61, 62, and 63 may be disposed between the carriers 10 and 70. The electronic component 61 may be disposed over the surface 10*s*1 of the carrier 10. In some embodiments, the electronic component 61 may have an active surface (not annotated in the figures) facing away from the carrier 10. The electronic component 62 may be disposed over the electronic component 61. In some embodiments, the electronic component 62 may have an active surface facing the electronic component 61. In some embodiments, the electronic component 62 may be electrically connected to the electronic component 61 through a redistribution structure 82.

The electronic component 63 may be disposed below the surface 70*s*1 of the carrier 70. The electronic component 64 may be disposed over the surface 70*s*2 of the carrier 70. In some embodiments, the electronic component 63 may be electrically connected to the electronic component 64 through the carrier 70. In some embodiments, the electronic component 63 may have an active surface facing the carrier 70. In some embodiments, the electronic component 64 may have an active surface facing the carrier 70.

In some embodiments, the electronic device 1*a* may further include a grounding pattern 81. In some embodiments, the grounding pattern 81 may be electrically connected to ground. In some embodiments, the interconnection 31 may be electrically connected to the grounding pattern 81. In some embodiments, the electrical shielding layer 50 may be electrically connected to the grounding pattern 81. In some embodiments, the grounding pattern 81 may be disposed over the surface 10*s*2 of the carrier 10. In some embodiments, the grounding pattern 81 may be disposed between the conductive elements 311 and 312. The location of the grounding pattern 81 may depend on design requirements, and the present disclosure is not intended to limit the same.

In some embodiments, the dielectric layer 21, the redistribution structure 82, the conductive element 312, and the conductive element 412 may be included in a substrate 71. The substrate 71 may have surfaces 71*s*1, 71*s*2, and 71*s*3. The electronic component 61 may be disposed under the surface 71*s*1. The electronic component 62 may be disposed over the surface 71*s*2. The surface 71*s*3 may extend between the surface 71*s*1 and 71*s*2. The surface 71*s*1 may be substantially coplanar with the surface 20*s*1.

In a comparative electronic device, at least three or more interconnection arrays are included in an interposer to satisfy the requirement of a characteristic impedance of the electronic device. The outer array and the inner array include interconnections electrically connected to ground. The middle array includes interconnections configured to transmit a data signal, such as an RF signal. Since the interconnection may have a relatively large dimension, the comparative electronic device may be relatively large. In the embodiments of the present disclosure, one of interconnection arrays is replaced by a shielding wall (e.g., electrical shielding layer 50), which may reduce the size of the electronic device 1*a*. Further, the shielding wall may provide a relatively large area for reducing attenuation of a data signal. Therefore, the electronic device 1*a* may provide improved performance in comparison with the comparative electronic device.

Figure 2A:
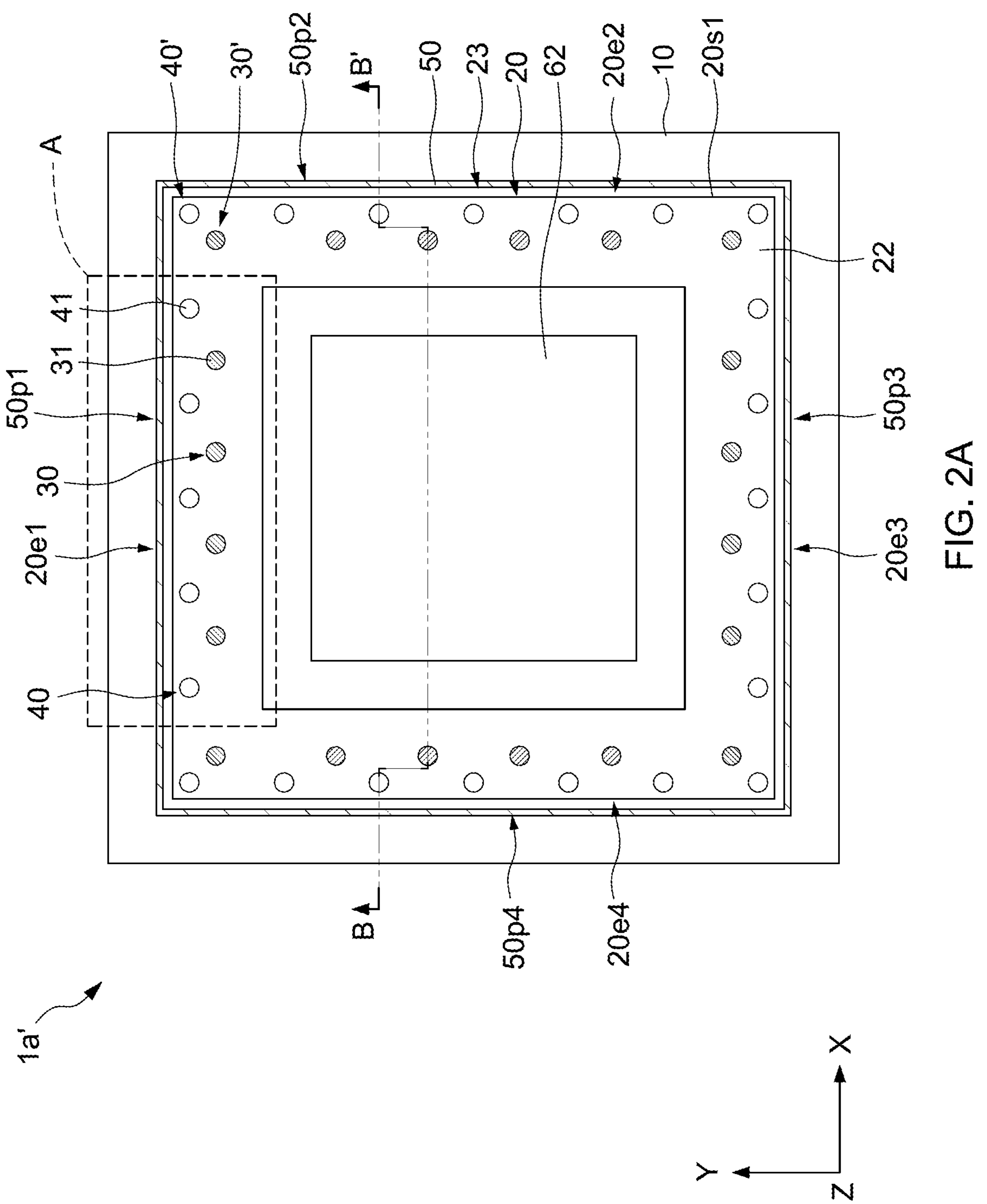
FIG. 2A is a top view of an electronic device, in accordance with an embodiment of the present disclosure.
Figure 2B:
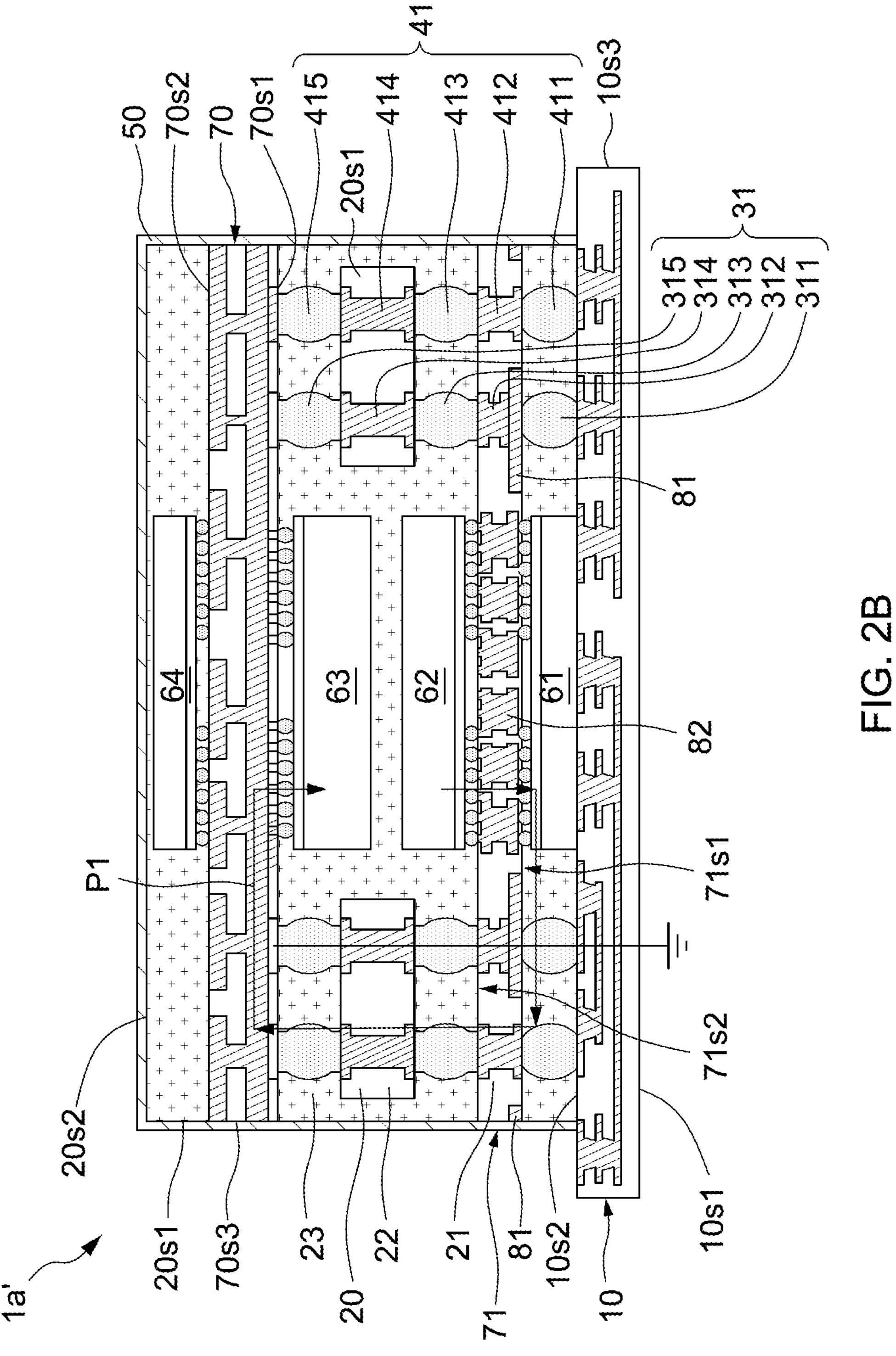
FIG. 2B is a cross-sectional view along line B-B' of the electronic device as shown in FIG. 2A, in accordance with an embodiment of the present disclosure.

FIG. 2A is a top view of an electronic device 1*a*', in accordance with an embodiment of the present disclosure. FIG. 2B is a cross-sectional view along line B-B' of the electronic device 1*a*' as shown in FIG. 2A, in accordance with an embodiment of the present disclosure. The electronic device 1*a*' is similar to the electronic device 1*a*, with differences therebetween as follow.

As shown in FIG. 2A, the interposer 20 may be spaced apart from the electrical shielding layer 50. In some embodiments, the interposer 20 may be spaced apart from the electrical shielding layer 50 by the dielectric layer 23. In some embodiments, the interconnection array (e.g., 30 or 30') may be spaced apart from the interconnection array (e.g., 40 or 40') by at least one medium, such as the dielectric layer 22. In some embodiments, the interconnection array (e.g., 40 or 40') may be spaced apart from the shielding wall (e.g., 50*p*1, 50*p*2, 50*p*3 or 50*p*4) by at least two mediums, such as dielectric layers 22 and 23.

As shown in FIG. 2B, the interconnection 31 may be spaced apart from the interconnection 41 by at least one medium, such as the dielectric layer 22. In some embodiments, the interconnection 41 may be spaced apart from the electrical shielding layer 50 by at least two mediums, such as dielectric layers 22 and 23. In some embodiments, the interconnection 31 may be spaced apart from the electrical shielding layer 50 by at least two mediums, such as dielectric layers 22 and 23. In some embodiments, the conductive element 314 may be spaced apart from the conductive element 414 by at least one medium, such as the dielectric layer 22. In some embodiments, the conductive element 414 may be spaced apart from the electrical shielding layer 50 by at least two mediums, such as dielectric layers 22 and 23.

In some embodiments, a signal path P1 may be provided between the electronic components 62 and 63. The signal path P1 may pass through the redistribution structure 82. The signal path P1 may pass through the interconnection 41. The signal path P1 may pass through the conductive element 414. The electronic component 62 may be electrically connected to the electronic component 63 through the signal path P1.

Figure 3:
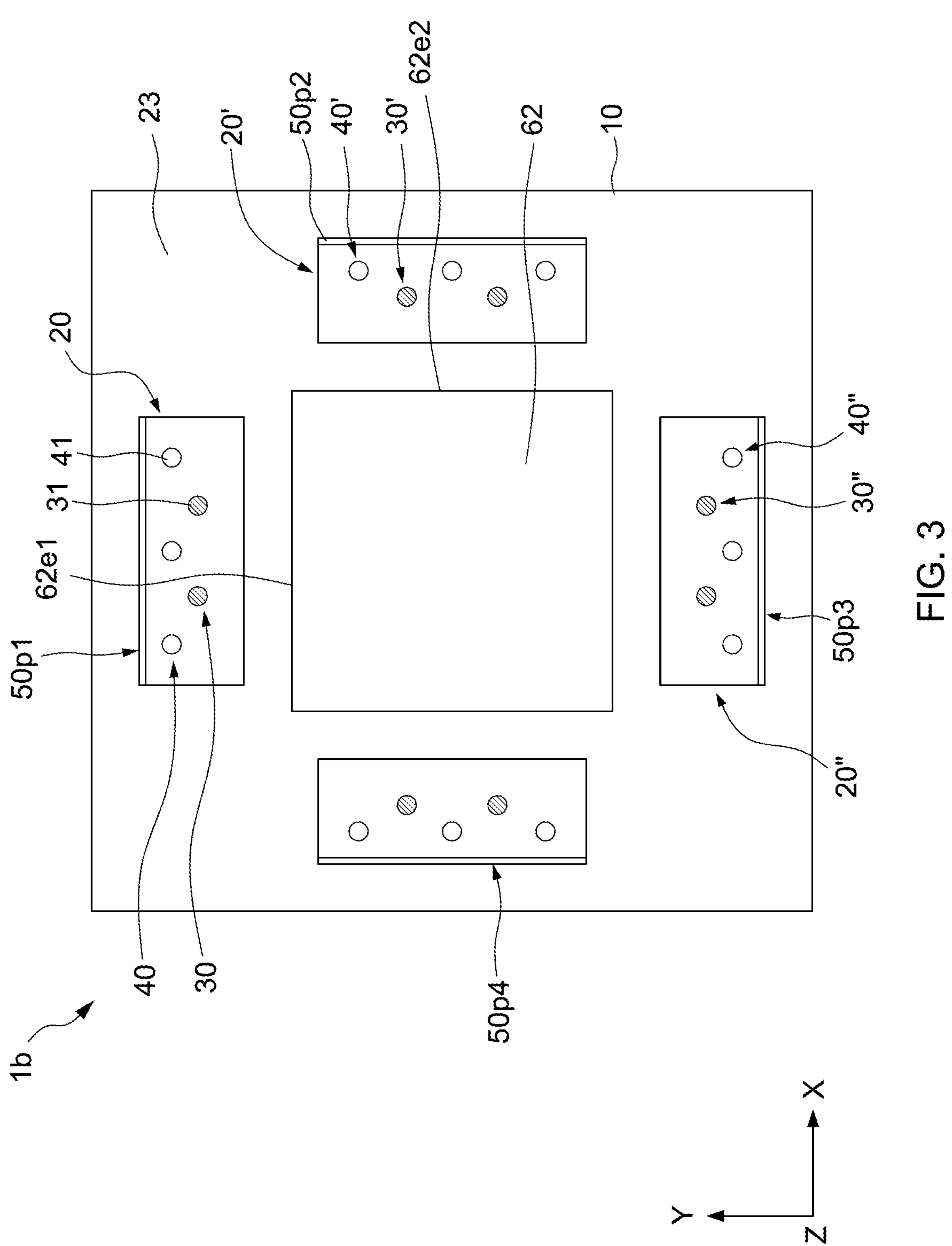
FIG. 3 is a top view of an electronic device, in accordance with an embodiment of the present disclosure.

FIG. 3 is a top view of an electronic device 1*b*, in accordance with an embodiment of the present disclosure. The electronic device 1*b* is similar to the electronic device 1*a*, with differences therebetween as follow.

In some embodiments, the electronic device 1*b* may include a plurality of interposers (e.g., 20, 20', and 20"). The interposer 20 may be disposed at a side 62*e*1 of the electronic component 62. The interposer 20' may be disposed at a side 62*e*2 of the electronic component 62. The interposer 20, 20', and 20" may be spaced apart from each other. In some embodiments, the interconnection array 30 may be disposed in the interposer 20. In some embodiments, the interconnection array 40 may be disposed in the interposer 20. In some embodiments, the interconnection array 30' may be disposed in the interposer 20'. In some embodiments, the interconnection array 40' may be disposed in the interposer 20'. In some embodiments, the interconnection array 30" may be disposed in the interposer 20". In some embodiments, the interconnection array 40" may be disposed in the interposer 20". The shielding wall 50*p*1 may be disposed on an external surface of the interposer 20. The shielding wall 50*p*2 may be disposed on an external surface of the interposer 20'. The shielding wall 50*p*3 may be disposed on an external surface of the interposer 20".

Figure 4A:
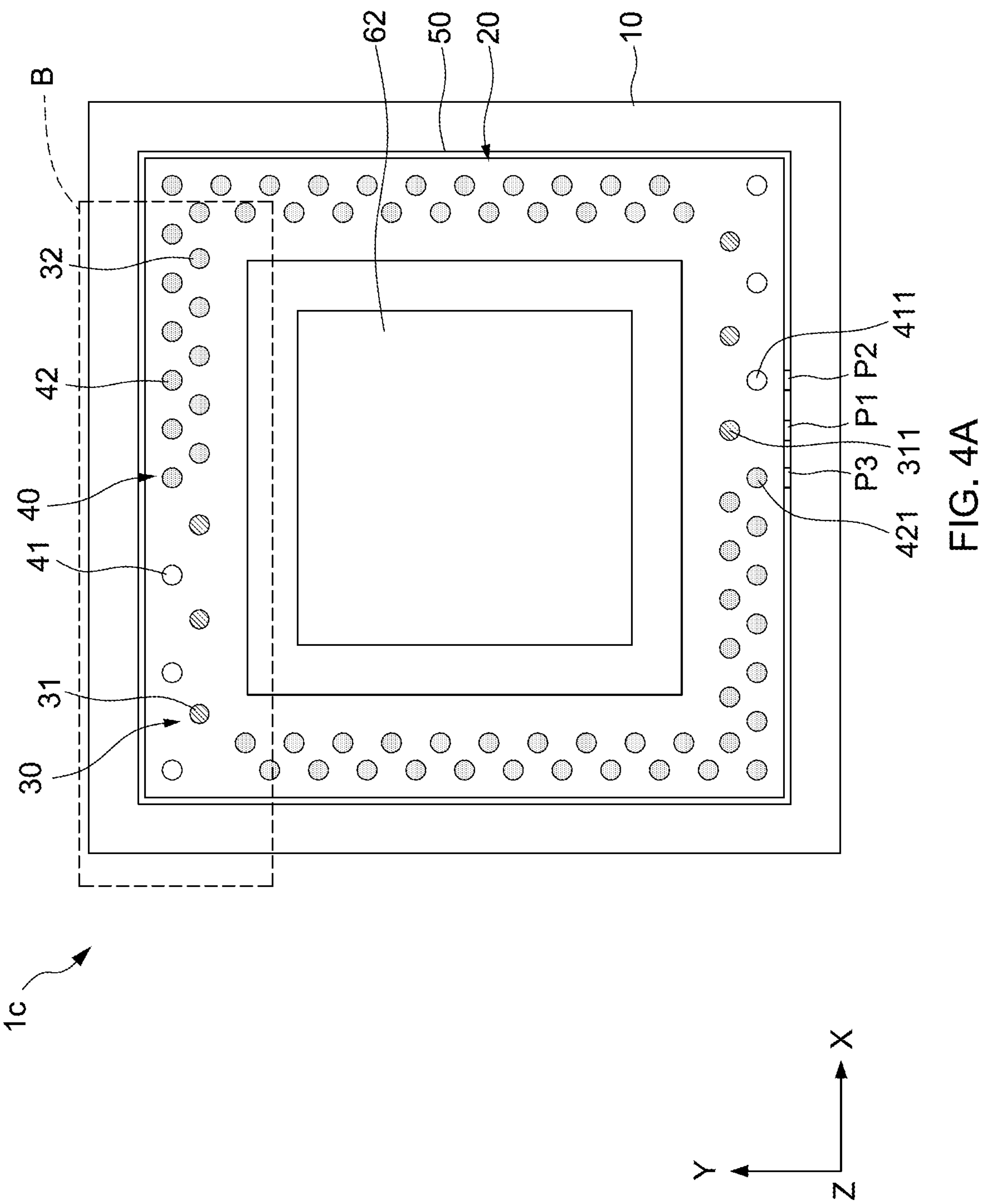
FIG. 4A is a top view of an electronic device, in accordance with an embodiment of the present disclosure.

FIG. 4A is a top view of an electronic device 1*c*, in accordance with an embodiment of the present disclosure. The electronic device 1*c* is similar to the electronic device 1*a*, with differences therebetween as follow.

In some embodiments, the interconnection array 30 may further include a plurality of interconnections 32. In some embodiments, the interconnection 31 and the interconnection 32 may be aligned along the X-axis or the Y-axis. In some embodiments, the interconnection 32 may be configured to transmit a power signal or a data signal with a relatively low frequency (e.g., a digital signal).

In some embodiments, the interconnection array 40 may further include a plurality of interconnections 42. In some embodiments, the interconnection 41 and the interconnection 42 may be aligned along the X-axis or the Y-axis. In some embodiments, the interconnection 42 may be configured to transmit a power signal or a data signal with a relatively low frequency (e.g., a digital signal). In some embodiments, the interconnections 32 and the 42 may be staggered. In some embodiments, one of the interconnections 41 may be disposed at the corner of the interposer 20. In some embodiments, one of the interconnections 42 may be disposed at the corner of the interposer 20.

Figure 4B:
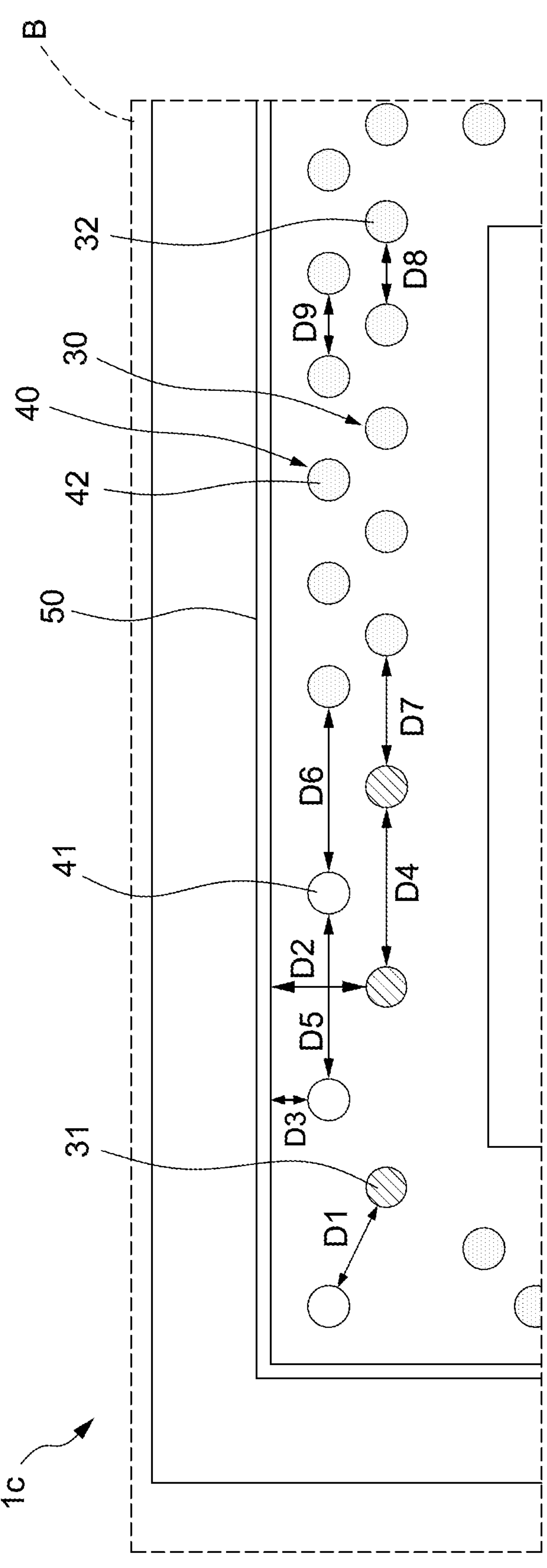
FIG. 4B is an enlarged view of region B of the electronic device as shown in FIG. 4A, in accordance with an embodiment of the present disclosure.

FIG. 4B is an enlarged view of region B of the electronic device 1*c* as shown in FIG. 4A, in accordance with an embodiment of the present disclosure.

Two adjacent interconnections 41 and 42 may have a distance D6 therebetween. In some embodiments of the present disclosure, the distance D6 is a length starting at the interconnection 41 and ending at the interconnection 42. In some embodiments of the present disclosure, the distance D6 is a length starting at a peripheral of the interconnection 41 and ending at a peripheral the interconnection 42. In some embodiments of the present disclosure, the distance D6 is a length starting at a cross-sectional center of the interconnection 41 and ending at a cross-sectional center of the interconnection 42. Two adjacent interconnections 31 and 32 may have a distance D7 (or a pitch) therebetween. In some embodiments of the present disclosure, the distance D7 is a length starting at the interconnection 31 and ending at the interconnection 32. In some embodiments of the present disclosure, the distance D7 is a length starting at a peripheral of the interconnection 31 and ending at a peripheral the interconnection 32. In some embodiments of the present disclosure, the distance D7 is a length starting at a cross-sectional center of the interconnection 31 and ending at a cross-sectional center of the interconnection 32. In some embodiments, the distance D6 may exceed the distance D1. In some embodiments, the distance D6 may exceed the distance D7. When the interconnection 31 is closer to the interconnection 41 than the interconnection 32, a signal (e.g., an RF signal) passing through the interconnection 41 may be better protected from attenuation or distortion.

Two adjacent interconnections 32 may have a distance D8 (or a pitch) therebetween. In some embodiments of the present disclosure, the distance D8 is a length starting at one interconnection 32 and ending at another interconnection 32. In some embodiments of the present disclosure, the distance D8 is a length starting at a peripheral of one interconnection 32 and ending at a peripheral another interconnection 32. In some embodiments of the present disclosure, the distance D8 is a length starting at a cross-sectional center of one interconnection 32 and ending at a cross-sectional center of another interconnection 32. Two adjacent interconnections 42 may have a distance D9 (or a pitch) therebetween. In some embodiments, the distance D8 may substantially equal the distance D9. In some embodiments of the present disclosure, the distance D9 is a length starting at one interconnection 42 and ending at another interconnection 42. In some embodiments of the present disclosure, the distance D9 is a length starting at a peripheral of one interconnection 42 and ending at a peripheral another interconnection 42. In some embodiments of the present disclosure, the distance D9 is a length starting at a cross-sectional center of one interconnection 42 and ending at a cross-sectional center of another interconnection 42. In some embodiments, the distance D8 may be less than the distance D1. In some embodiments, the distance D8 may be less than the distance D4. In some embodiments, the distance D8 may be less than the distance D5.

Referring back to FIG. 4A, the outermost interconnection 31 (e.g., 311) may have a projection P1 on the electrical shielding layer 50. The outermost interconnection 41 (e.g., 411) may have a projection P2 on the electrical shielding layer 50. The outermost interconnection 42 (e.g., 421) may have a projection P3 on the electrical shielding layer 50. In some embodiments, the projection P1 may be located between the projections P2 and P3.

In this embodiment, the interconnections (e.g., 32 and 42) may further be configured to transmit a power signal or a digital signal, which facilitates the integration of electronic components (e.g., 61, 62, 63, and/or 64) with different functions.

Figure 5A:
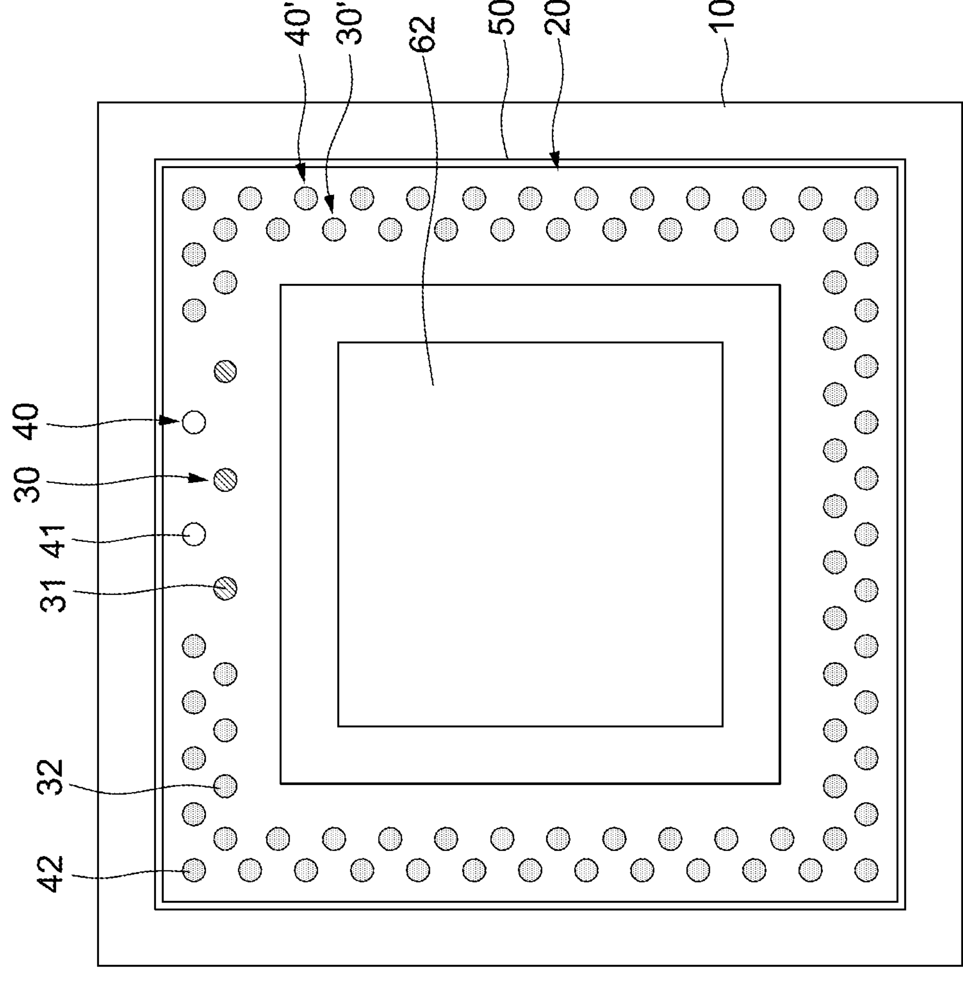
FIG. 5A is a top view of an electronic device, in accordance with an embodiment of the present disclosure.
Figure 5A:
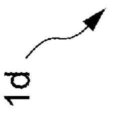
Figure 5A:
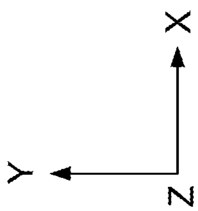

FIG. 5A is a top view of an electronic device 1*d*, in accordance with an embodiment of the present disclosure. The electronic device 1*d* is similar to the electronic device 1*c*, with differences therebetween as follow.

In some embodiments, the interconnections 42 may be disposed at four corners of the interposer 20. In some embodiments, the interconnection 41 may be distant from the corner of the interposer 20.

Figure 5B:
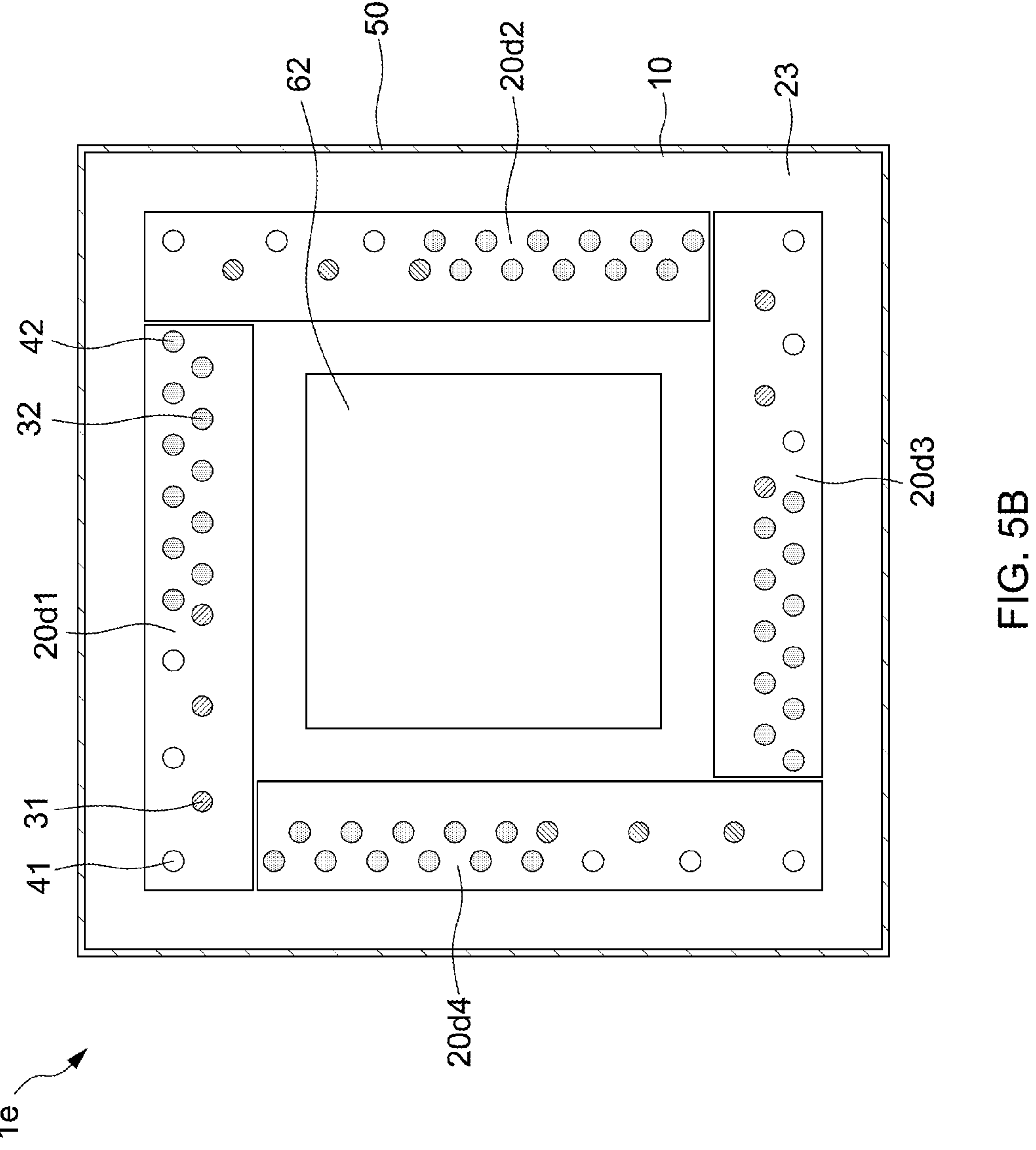
FIG. 5B is a top view of an electronic device, in accordance with an embodiment of the present disclosure.

FIG. 5B is a top view of an electronic device 1*e*, in accordance with an embodiment of the present disclosure. The electronic device 1*e* is similar to the electronic device 1*c*, with differences therebetween as follow.

In some embodiments, the interposer 20 may include a plurality of portions 20*d*1, 20*d*2, 20*d*3, and 20*d*4 separate from one another. In some embodiments, the interconnection 31 may be disposed within the portion 20*d*1, 20*d*2, 20*d*3, and/or 20*d*4. In some embodiments, the interconnection 32 may be disposed within the portion 20*d*1, 20*d*2, 20*d*3, and/or 20*d*4. In some embodiments, the interconnection 41 may be disposed within the portion 20*d*1, 20*d*2, 20*d*3, and/or 20*d*4. In some embodiments, the interconnection 42 may be disposed within the portion 20*d*1, 20*d*2, 20*d*3, and/or 20*d*4. Each of the portions 20*d*1, 20*d*2, 20*d*3, and/or 20*d*4 may be regarded as one interposer.

Figure 6A:
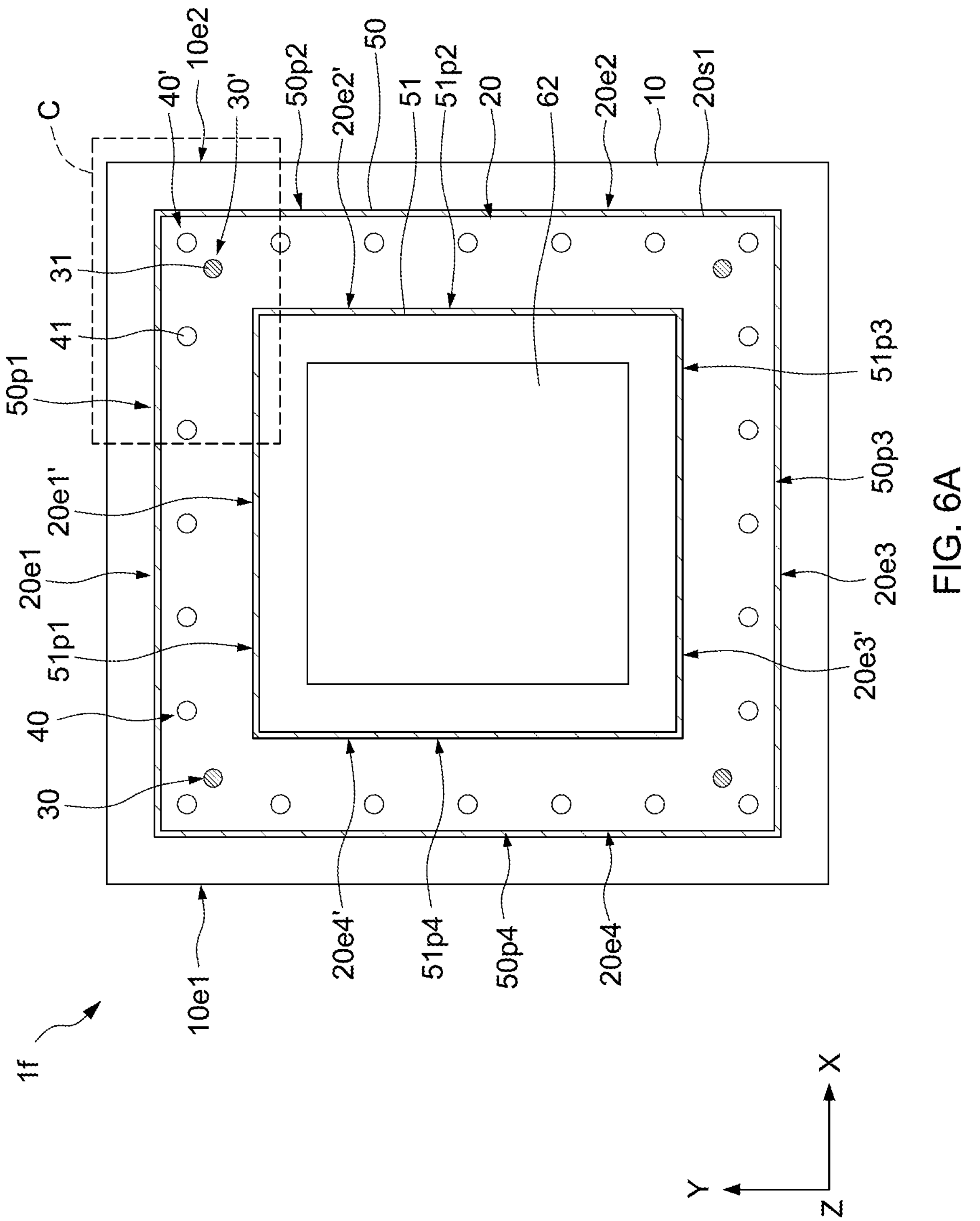
FIG. 6A is a top view of an electronic device, in accordance with an embodiment of the present disclosure.
Figure 6B:
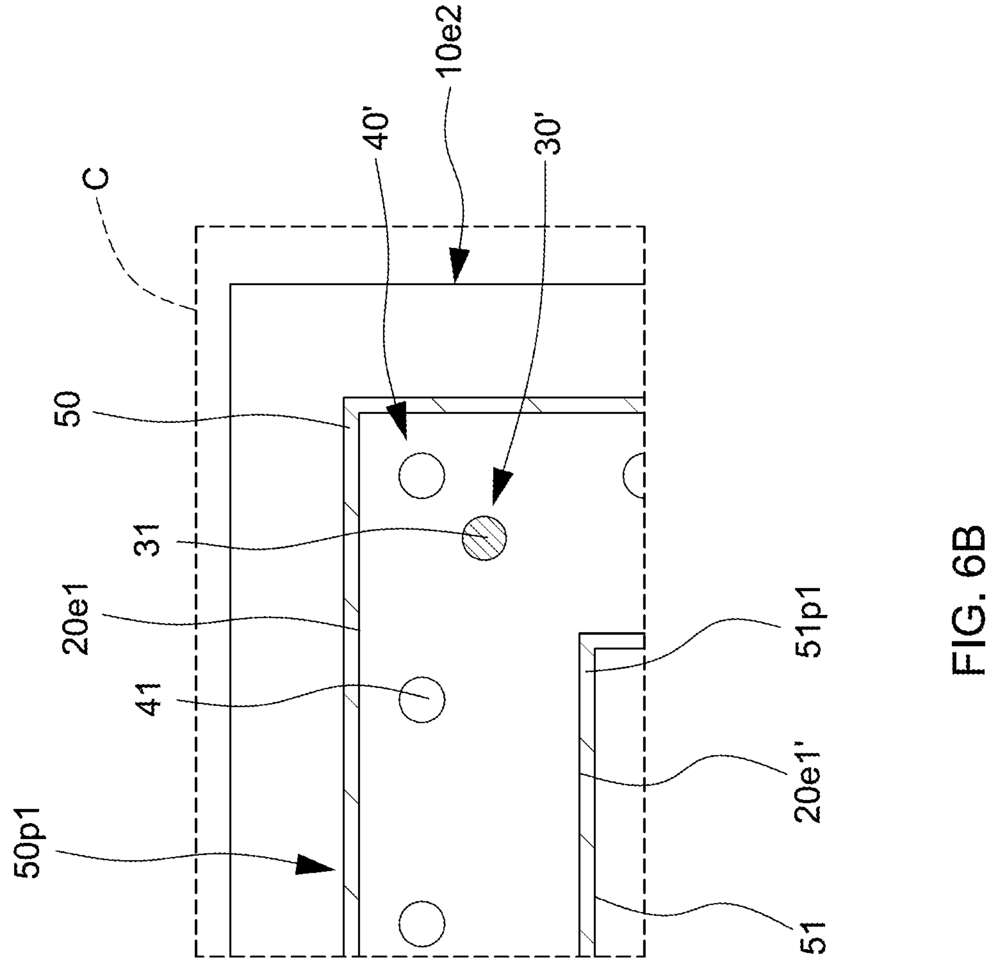
FIG. 6B is an enlarged view of region C of the electronic device as shown in FIG. 6A, in accordance with an embodiment of the present disclosure.

FIG. 6A is a top view of an electronic device 1*f*, in accordance with an embodiment of the present disclosure. FIG. 6B is an enlarged view of region C of the electronic device 1*f* as shown in FIG. 6A, in accordance with an embodiment of the present disclosure. The electronic device 1*f* is similar to the electronic device 1*a*, with differences therebetween as follow.

The carrier 10 may include an edge 10*e*1 and an edge 10*e*2 opposite to the edge 10*e*1. The interposer 20 may include edges 20*e*1', 20*e*2', 20*e*3', and 20*e*4'. In some embodiments, the electronic device 1*f* may include an electrical shielding layer 51. The electrical shielding layer 51 may be configured to prevent a signal (e.g., a data signal), passing through the interconnection 41, from attenuation or distortion. In some embodiments, the electrical shielding layer 51 may be configured to protect the electronic components (e.g., 62) from EMI. The electrical shielding layer 51 may be surrounded by the electrical shielding layer 50. The electrical shielding layer 51 may include shielding walls 51*p*1, 51*p*2, 51*p*3, and 51*p*4. The shielding wall 51*p*1 may be disposed adjacent to the side 20*e*1'. The shielding wall 51*p*2 may be disposed adjacent to the side 20*e*2'. The shielding wall 51*p*3 may be disposed adjacent to the side 20*e*3'. The shielding wall 51*p*4 may be disposed adjacent to the side 20*e*4'.

In some embodiments, the number of the interconnection 31 may be less than that of the interconnection 41. In this embodiment, the electrical shielding layer 50, the electrical shielding layer 51, and the interconnection 31 may collectively be configured to protect the interconnection 41 from EMI, and thus the number of the interconnection 31 may be reduced.

Figure 7B:
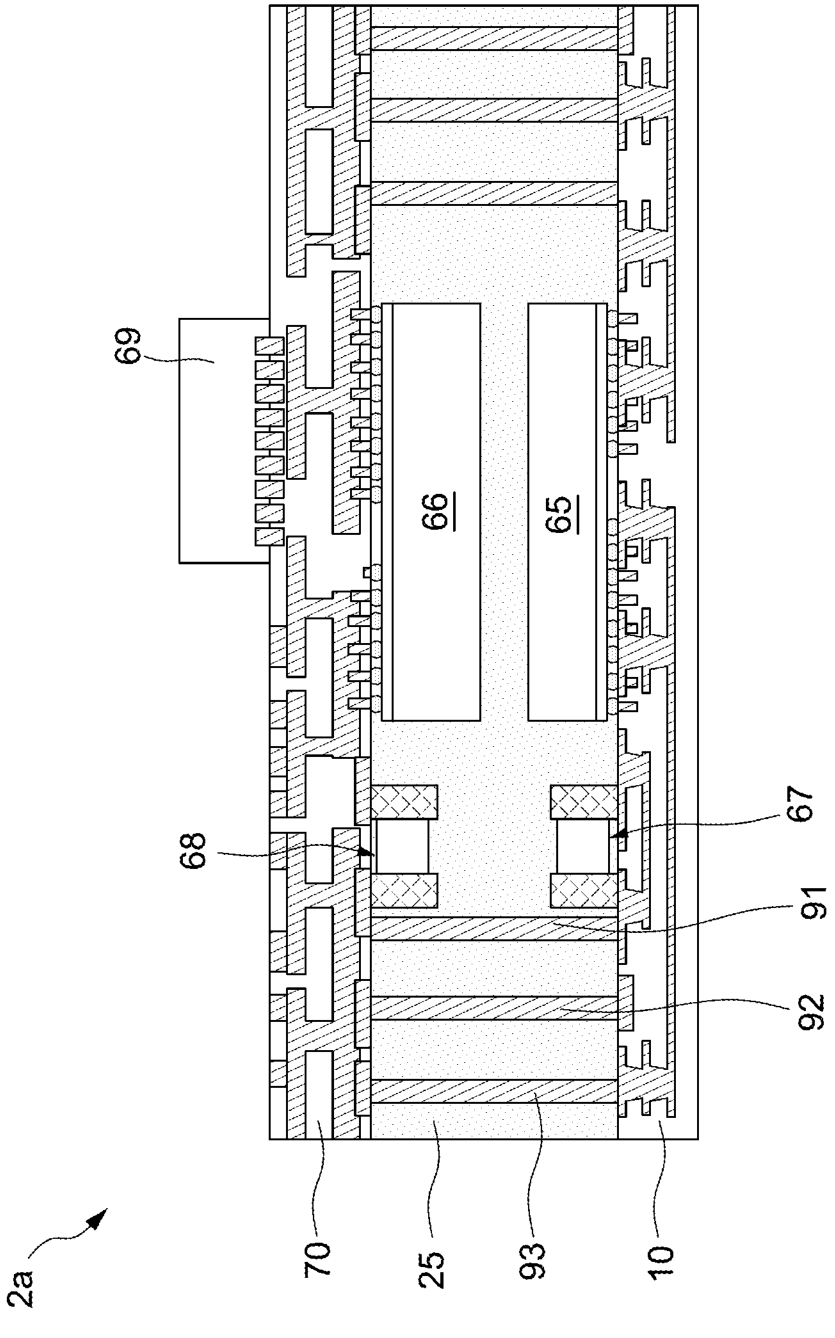
FIG. 7B is a cross-sectional view along line C-C' of the electronic device as shown in FIG. 7A.

Referring to FIG. 7A and FIG. 7B, FIG. 7A is a top view of an electronic device 2*a*, and FIG. 7B is a cross-sectional view along line C-C' of the electronic device 2*a* as shown in FIG. 7A.

The electronic device 2*a* may include electronic components 65, 66, 67, 68, and 69. Each of the electronic components 65, 66, and 69 may include a chip or a die. Each of the electronic components 67 and 68 may include a passive device, such as a capacitance, an inductor, or the like. The electronic components 65, 66, 67, and 68 may be covered by the dielectric structure 25. The electronic component 69 may be disposed over the carrier 70.

The electronic device 2*a* may further include inner interconnection array 91, center interconnection array 92, and outer interconnection array 93. Each of the inner interconnection array 91, center interconnection array 92, and outer interconnection array 93 may penetrate the dielectric structure 25. Each of the inner interconnection array 91, center interconnection array 92, and outer interconnection array 93 may include, for example, a conductive pillar and/or other suitable elements, such as a conductive trace and a conductive pad.

The inner interconnection array 91 may include a plurality of interconnections, each of which is electrically connected to ground. The center interconnection array 92 may include a plurality of interconnections, each of which is configured to transmit a data signal (e.g., RF signal or the like). The outer interconnection array 93 may include a plurality of interconnections, each of which is electrically connected to ground. The interconnection of the center interconnection array 92 may be surrounded by the interconnections of the inner interconnection array 91 and outer interconnection array 93 to reduce the attenuation of a data signal. Further, the electronic device 2*a* has at least three interconnection arrays to satisfy the requirement of characteristic impedance. In comparison with the electronic device 1*a*, the electronic device 2*a* is relatively large.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the term "a distance between A and B" may refer to a length from an edge of the A to an edge of the B or to a length from a center of the A to a center of the B.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:

a first electronic component having a first edge;

a first interposer;

a first interconnection array disposed in the first interposer and electrically connected to ground;

a first shielding wall continuously extending at a side of the first interconnection array; and a second interconnection array disposed between the first shielding wall and the first interconnection array, wherein the second interconnection array is configured to transmit a signal, wherein the first interconnection array, the second interconnection array, and the first shielding wall are located at the first edge of the first electronic component.

2. The electronic device of claim 1, wherein the first interconnection array and the second interconnection array constitute a first interconnection structure with two columns between the first shielding wall and the first edge of the first electronic component.

3. The electronic device of claim 2, further comprising:

a third interconnection array disposed in the first interposer and electrically connected to ground;

a second shielding wall; and a fourth interconnection array disposed between the second shielding wall and the third interconnection array, wherein the first electronic component has a second edge substantially orthogonal to the first edge in a top view, and the third interconnection array, the fourth interconnection array, and the second shielding wall are located at the second edge of the first electronic component.

4. The electronic device of claim 3, wherein the third interconnection array and the fourth interconnection array constitute a second interconnection structure with two rows between the second shielding wall and the second edge of the first electronic component.

5. The electronic device of claim 2, wherein no additional interconnection array is disposed between the second interconnection array and the first shielding wall and between the first interconnection array and the first edge of the first electronic component.

6. The electronic device of claim 5, wherein the first interposer comprises a dielectric layer encapsulating the first interconnection array and the second interconnection array, and the first shielding wall is disposed on an external side of the dielectric layer.

7. The electronic device of claim 1, further comprising:

a second electronic component electrically connected to the first electronic component, wherein an active surface of the first electronic component faces an active surface of the second electronic component.

8. The electronic device of claim 1, wherein the first shielding wall is disposed along a first side of the first interposer and spaced apart from the first interposer.

9. The electronic device of claim 8, wherein the first interconnection array is spaced apart from the second interconnection array by at least one medium, and the second interconnection array is spaced apart from the first shielding wall by at least two mediums.

10. The electronic device of claim 9, wherein the first interposer comprises a dielectric layer encapsulating the first interconnection array and the second interconnection array.

11. The electronic device of claim 1, further comprising:

an encapsulant encapsulating the first interposer and contacting the first shielding wall.

12. The electronic device of claim 1, wherein the first shielding wall is configured to cover at least two edges of the first interposer and to prevent the second interconnection array from electromagnetic interference.

13. The electronic device of claim 1, wherein the first interposer has a first edge and a second edge opposite to the first edge, the first interconnection array comprises a first interconnection, and the second interconnection array comprises a second interconnection abutting the first interconnection, and wherein a projected length from the first interconnection to the second interconnection is greater than a first distance between the second interconnection and the first edge of the first interposer, and wherein the projected length is a projection of a length starting at the first interconnection and ending at the second interconnection as projected on an imaginary plane perpendicular to the first edge of the first interposer.

14. The electronic device of claim 13, wherein a second distance between the first interconnection and the first edge of the first interposer is greater than the first distance.

15. The electronic device of claim 13, wherein the second interconnection is closer to the first shielding wall than the first interconnection is.

16. The electronic device of claim 13, further comprising:

an encapsulant separating the first interposer from the first shielding wall.

17. The electronic device of claim 1, further comprising:

a first substrate; and a second substrate disposed over the first substrate, wherein the first interposer is disposed between the first substrate and the second substrate, and the first shielding wall extends from a side of the first substrate to a side of the second substrate, and wherein the first interconnection array and the first shielding wall are configured to prevent the second interconnection array from electromagnetic interference.

18. The electronic device of claim 17, further comprising:

an encapsulant disposed between the first substrate and the second substrate and located between the first shielding wall and a lateral side of the first interposer.

19. The electronic device of claim 17, wherein the first electronic component is disposed between the first substrate and the second substrate, and wherein the first electronic component is electrically connected to the second interconnection array.

20. The electronic device of claim 19, further comprising:

a second electronic component disposed between the first electronic component and the second substrate, wherein the second electronic component is electrically connected to the first electronic component through the second interconnection array.

* * * * *